United States Patent
Inazu et al.

(10) Patent No.: US 12,243,965 B2
(45) Date of Patent: Mar. 4, 2025

(54) SEMICONDUCTOR LIGHT-EMITTING ELEMENT AND METHOD OF MANUFACTURING SEMICONDUCTOR LIGHT-EMITTING ELEMENT

(71) Applicant: NIKKISO CO., LTD., Tokyo (JP)

(72) Inventors: Tetsuhiko Inazu, Hakusan Ishikawa (JP); Noritaka Niwa, Hakusan Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 347 days.

(21) Appl. No.: 17/378,106

(22) Filed: Jul. 16, 2021

(65) Prior Publication Data

US 2022/0045243 A1 Feb. 10, 2022

(30) Foreign Application Priority Data

Aug. 7, 2020 (JP) .................................. 2020-135287

(51) Int. Cl.
*H01L 33/40* (2010.01)
*H01L 33/44* (2010.01)
*H01L 33/32* (2010.01)

(52) U.S. Cl.
CPC ............ *H01L 33/405* (2013.01); *H01L 33/44* (2013.01); *H01L 33/32* (2013.01); *H01L 2933/0058* (2013.01)

(58) Field of Classification Search
CPC .................................................. H01L 33/405
USPC ....................................................... 257/76
See application file for complete search history.

(56) References Cited

U.S. PATENT DOCUMENTS

2011/0089401 A1* 4/2011 Hiraiwa ............... H01L 33/405
257/E33.072
2016/0079467 A1* 3/2016 Totani ................. H01L 33/0095
438/47

FOREIGN PATENT DOCUMENTS

| CN | 106410004 A | 2/2017 |
| JP | 2007227820 A | 9/2007 |
| JP | 2007300063 A | 11/2007 |
| JP | 2016058533 A | 4/2016 |

OTHER PUBLICATIONS

Machine translation of Goto et al., JP 2016-058533 (Year: 2016).*
Machine translation of Horio et al., JP 2007-227820 (Year: 2007).*
Office Action (with English translation) issued for corresponding Japanese Patent Application No. 2020-135287 dated Oct. 27, 2020 (5 pages).

* cited by examiner

*Primary Examiner* — Hsin Yi Hsieh
(74) *Attorney, Agent, or Firm* — MUNCY, GEISSLER, OLDS & LOWE, P.C.

(57) ABSTRACT

A semiconductor light-emitting element includes: an n-type semiconductor layer made of an n-type AlGaN-based semiconductor material; an active layer provided on the n-type semiconductor layer and made of an AlGaN-based semiconductor material; a p-type semiconductor layer provided on the active layer; and a p-side contact electrode that includes an Rh layer in contact with an upper surface of the p-type semiconductor layer and having a thickness of 10 nm or smaller and an Al layer in contact with an upper surface of the Rh layer and having a thickness of 20 nm or larger.

4 Claims, 5 Drawing Sheets

SEMICONDUCTOR LIGHT-EMITTING ELEMENT AND METHOD OF MANUFACTURING SEMICONDUCTOR LIGHT-EMITTING ELEMENT

RELATED APPLICATION

Priority is claimed to Japanese Patent Application No. 2020-135287, filed on Aug. 7, 2020, the entire content of which is incorporated herein by reference.

BACKGROUND OF THE INVENTION

1. Field of the Invention

Technical Field

The present invention relates to a semiconductor light-emitting element and a method of manufacturing a semiconductor light-emitting element.

2. Description of the Related Art

Background Art

A semiconductor light-emitting element includes an n-type semiconductor layer, an active layer, and a p-type semiconductor layer stacked on a substrate, and a p-side electrode is provided on the p-type semiconductor layer. In a semiconductor light-emitting element in which a nitride semiconductor such as GaN and AlGaN is used, Rh, Pt, or the like having a high reflection efficiency for the emission wavelength is selected as a material for the p-side electrode (see, for example, JP2007-300063).

For the purpose of improving the light extraction efficiency further, it is preferred to reduce the contact resistance of the p-side electrode relative to the p-type semiconductor layer and increasing the ultraviolet reflectivity of the p-side electrode further.

SUMMARY OF THE INVENTION

The present invention addresses the above-described issue, and an illustrative purpose thereof is to improve the light extraction efficiency of a semiconductor light-emitting element.

A semiconductor light-emitting element includes: an n-type semiconductor layer made of an n-type AlGaN-based semiconductor material; an active layer provided on the n-type semiconductor layer and made of an AlGaN-based semiconductor material; a p-type semiconductor layer provided on the active layer; and a p-side contact electrode that includes an Rh layer in contact with an upper surface of the p-type semiconductor layer and having a thickness of 10 nm or smaller and an Al layer in contact with an upper surface of the Rh layer and having a thickness of 20 nm or larger.

According to this embodiment, the contact resistance is suitably reduced by using Rh in a portion of the p-side contact electrode in contact with the p-type semiconductor layer. Moreover, the reflectivity for ultraviolet light is increased as compared with a case in which only Rh is used, by combining an Rh layer having a thickness of 10 nm or smaller and an Al layer having a thickness of 20 nm or smaller. This realizes a semiconductor light-emitting element having an even higher light extraction efficiency.

A reflectivity of the p-side contact electrode for ultraviolet light incident from the p-type semiconductor layer and having a wavelength of 280 nm may be 70% or higher.

An area in which the Rh layer and the Al layer of the p-side contact electrode are formed may be 80% of an area of the upper surface of the p-type semiconductor layer or larger.

The p-side contact electrode may further include a Ti layer provided on the Al layer and having a thickness of 10 nm or larger.

The semiconductor light-emitting element may further include: a protective layer that has a p-side pad opening provided on the p-side contact electrode, covers the p-side contact electrode in a portion different from the p-side pad opening, and includes an oxide dielectric material; and a p-side pad electrode provided on the protective layer and connected to the p-side contact electrode in the p-side pad opening.

Another embodiment of the present invention relates to a method of manufacturing a semiconductor light-emitting element. The method includes: forming an active layer made of an AlGaN-based semiconductor material on an n-type semiconductor layer made of an n-type AlGaN semiconductor material; forming a p-type semiconductor layer on the active layer; forming a p-side contact electrode that includes an Rh layer in contact with an upper surface of the p-type semiconductor layer and having a thickness of 10 nm or smaller and an Al layer in contact with an upper surface of the Rh layer and having a thickness of 20 nm or larger; and annealing the p-side contact electrode.

According to this embodiment, the contact resistance is suitably reduced by using Rh in a portion of the p-side contact electrode in contact with the p-type semiconductor layer. Moreover, the reflectivity for ultraviolet light is increased as compared with a case in which only Rh is used, by combining an Rh layer having a thickness of 10 nm or smaller and an Al layer having a thickness of 20 nm or smaller and by annealing the p-side contact electrode. This realizes a semiconductor light-emitting element having an even higher light extraction efficiency.

An annealing temperature of the p-side contact electrode may be equal to or more than 500° C. and equal to or less than 650° C.

DETAILED DESCRIPTION OF THE INVENTION

Figure 1:
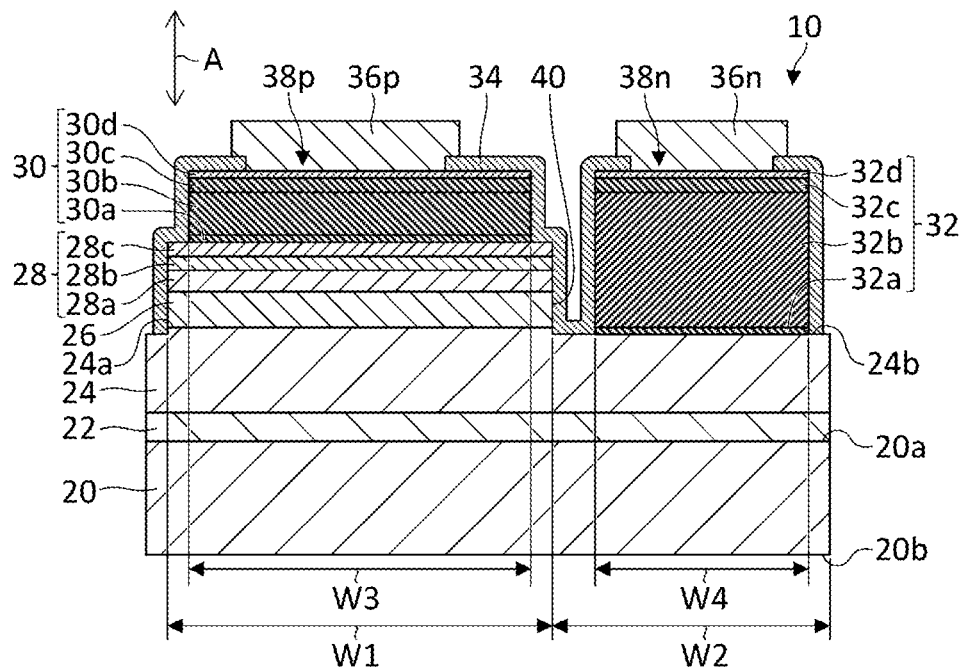
FIG. 1 is a cross-sectional view schematically showing a configuration of a semiconductor light-emitting element according to the embodiment.

The invention will now be described by reference to the preferred embodiments. This does not intend to limit the scope of the present invention, but to exemplify the invention.

A detailed description will be given of embodiments of the present invention with reference to the drawings. The same numerals are used in the description to denote the same elements, and a duplicate description is omitted as appropriate. To facilitate the understanding, the relative dimensions of the constituting elements in the drawings do not necessarily mirror the relative dimensions in the light-emitting element.

The embodiment relates to a semiconductor light-emitting element configured to emit "deep ultraviolet light" having a central wavelength A of about 360 nm or shorter and a so-called deep ultraviolet-light emitting diode (DUV-LED) chip. To output deep ultraviolet light having such a wavelength, an aluminum gallium nitride (AlGaN)-based semiconductor material having a band gap of about 3.4 eV or larger is used. The embodiment particularly shows a case of emitting deep ultraviolet light having a central wavelength A of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN of 1% or higher, and, preferably, 5% or higher, 10% or higher, or 20% or higher.

Those materials that do not contain AlN may be distinguished by referring to them as "GaN-based semiconductor materials". "GaN-based semiconductor materials" encompass GaN and InGaN. Similarly, those materials that do not contain GaN may be distinguished by referring to them as "AlN-based semiconductor materials". "AlN-based semiconductor materials" encompass AlN and InAlN.

FIG. 1 is a cross-sectional view schematically showing a configuration of a semiconductor light-emitting element 10 according to the embodiment. The semiconductor light-emitting element 10 includes a substrate 20, a base layer 22, an n-type semiconductor layer 24, an active layer 26, a p-type semiconductor layer 28, a p-side contact electrode 30, an n-side contact electrode 32, a protective layer 34, a p-side pad electrode 36p, and an n-side pad electrode 36n.

Referring to FIG. 1, the direction indicated by the arrow A may be referred to as "vertical direction" or "direction of thickness". In a view of the substrate 20, the direction away from the substrate 20 may be referred to as upward, and the direction toward the substrate 20 may be referred to as downward.

The substrate 20 includes a first principal surface 20a and a second principal surface 20b opposite to the first principal surface 20a. The first principal surface 20a is a crystal growth surface for growing the layers from the base layer 22 to the p-type semiconductor layer 28. The substrate 20 is made of a material having translucency for the deep ultraviolet light emitted by the semiconductor light-emitting element 10 and is made of, for example, a sapphire ($Al_2O_3$). A fine concave-convex pattern (not shown) having a sub-micron (1 µm or less) depth and pitch may be formed on the first principal surface 20a. The substrate 20 like this is also called a patterned sapphire substrate (PSS). The second principal surface 20b is a light extraction surface for extracting the deep ultraviolet light emitted by the active layer 26 outside. The substrate 20 may be made of AlN or made of AlGaN. The first principal surface 20a of the substrate 20 may be configured as a flat surface that is not patterned.

The base layer 22 is provided on the first principal surface 20a of the substrate 20. The base layer 22 is a foundation layer (template layer) to form the n-type semiconductor layer 24. For example, the base layer 22 is an undoped AlN layer and is, specifically, an AlN (HT-AlN; High Temperature AlN) layer grown at a high temperature. The base layer 22 may include an undoped AlGaN layer formed on the AlN layer. The base layer 22 may be comprised only of an undoped AlGaN layer when the substrate 20 is an AlN substrate or an AlGaN substrate. In other words, the base layer 22 includes at least one of an undoped AlN layer and an undoped AlGaN layer.

The n-type semiconductor layer 24 is provided on the base layer 22. The n-type semiconductor layer 24 is an n-type AlGaN-based semiconductor material layer. For example, the n-type semiconductor layer 24 is an AlGaN layer doped with Si as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is 25% or higher, and, preferably, 40% or higher or 50% or higher. The n-type semiconductor layer 24 has a band gap larger than the wavelength of the deep ultraviolet light emitted by the active layer 26. For example, the n-type semiconductor layer 24 is formed to have a band gap of 4.3 eV or larger. It is preferable to form the n-type semiconductor layer 24 such that the molar fraction of AlN is 80% or lower, i.e., the band gap is 5.5 eV or smaller. It is more desired to form the n-type semiconductor layer 24 such that the molar fraction of AlN is 70% or lower (i.e., the band gap is 5.2 eV or smaller). The n-type semiconductor layer 24 has a thickness of about 1 µm-3 µm. For example, the n-type semiconductor layer 24 has a thickness of about 2 µm.

The n-type semiconductor layer 24 is formed such that the concentration of Si as the impurity is equal to or more than $1\times10^{18}/cm^3$ and equal to or less than $5\times10^{19}/cm^3$. It is preferred to form the n-type semiconductor layer 24 such that the Si concentration is equal to or more than $5\times10^{18}/cm^3$ and equal to or less than $3\times10^{19}/cm^3$ and, more preferably, equal to or more than $7\times10^{18}/cm^3$ and equal to or less than $2\times10^{19}/cm^3$. In one example, the Si concentration in the n-type semiconductor layer 24 is around $1\times10^{19}/cm^3$ and is in a range equal to or more than $8\times10^{18}/cm^3$ and equal to or less than $1.5\times10^{19}/cm^3$.

The n-type semiconductor layer 24 includes a first upper surface 24a and a second upper surface 24b. The first upper surface 24a is where the active layer 26 is formed, and the second upper surface 24b is where the active layer 26 is not formed. The first upper surface 24a and the second upper surface 24b differ in height, and the height from the substrate 20 to the first upper surface 24a is larger than the height from the substrate 20 to the second upper surface 24b. The region where the first upper surface 24a is located is defined as "first region W1", and the region where the second upper surface 24b is located is defined as "second region W2". The second region W2 is adjacent to the first region W1.

The active layer 26 is provided on the first upper surface 24a of the n-type semiconductor layer 24. The active layer 26 is made of an AlGaN-based semiconductor material and has a double heterojunction structure by being sandwiched between the n-type semiconductor layer 24 and the p-type semiconductor layer 28. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 320 nm or shorter.

The active layer 26 has, for example, a monolayer or multilayer quantum well structure. The active layer 26 is comprised of a stack of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the well layer and the barrier layer may be additionally provided between the first barrier layer and the first well layer. The barrier layer and the well layer have a thickness of about 1 nm-20 nm, and have a thickness of, for example, about 2 nm-10 nm.

The active layer 26 may further include an electron blocking layer directly in contact with the p-type semiconductor layer 28. The electron blocking layer is an undoped AlGaN-based semiconductor material layer and is formed such that the molar fraction of AlN is 40% or higher, and, preferably, 50% or higher. The electron blocking layer may be formed such that the molar fraction of AlN is 80% or higher or may be made of an AlN-based semiconductor material that does not substantially contain GaN. The electron blocking layer has a thickness of about 1 nm-10 nm. For example, the electron blocking layer has a thickness of about 2 nm-5 nm.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 includes a p-type first clad layer 28a, a p-type second clad layer 28b, and a p-type contact layer 28c. The p-type first clad layer 28a, the p-type second clad layer 28b, and the p-type contact layer 28c are formed such that their AlN ratios differ.

The p-type first clad layer 28a is a p-type AlGaN layer having a relatively high AlN ratio, and the composition ratio thereof is selected to transmit the deep ultraviolet light emitted by the active layer 26. The p-type first clad layer 28a is formed such that the molar fraction of AlN is 40% or higher, and, preferably, 50% or higher, or 60% or higher. The AlN ratio of the p-type first clad layer 28a is, for example, similar to the AlN ratio of the n-type semiconductor layer 24 or larger than the AlN ratio of the n-type semiconductor layer 24. The AlN ratio of the p-type first clad layer 28a may be 70% or higher, or 80% or higher. The p-type first clad layer 28a has a thickness of about 10 nm-100 nm and has a thickness of, for example, about 15 nm-70 nm.

The p-type second clad layer 28b is a p-type AlGaN layer having a medium AlN ratio and has an AlN ratio lower than the AlN ratio of the p-type first clad layer 28a and higher than an AlN ratio of the p-type contact layer 28c. The p-type second clad layer 28b is formed such that, for example, the molar fraction of AlN is 25% or higher, and, preferably, 40% or higher, or 50% or higher. The AlN ratio of the p-type second clad layer 28b is configured to be, for example, about ±10% of the AlN ratio of the n-type semiconductor layer 24. The p-type second clad layer 28b has a thickness of about 5 nm-250 nm and has a thickness of, for example, about 10 nm-150 nm. The p-type second clad layer 28b may not be provided.

The p-type contact layer 28c is a p-type AlGaN layer or a p-type GaN layer having a relatively low AlN ratio. The p-type contact layer 28c is formed such that the AlN ratio is 20% or lower in order to obtain proper ohmic contact with the p-side contact electrode 30. Preferably, the p-type contact layer 28c is formed such that the AlN ratio is 10% or lower, 5% or lower, or 0%. In other words, the p-type contact layer 28c may be made of a p-type GaN-based semiconductor material that does not substantially contain AlN. As a result, the p-type contact layer 28c could absorb the deep ultraviolet light emitted by the active layer 26. It is preferred to form the p-type contact layer 28c to be thin to reduce the quantity of absorption of the deep ultraviolet light emitted by the active layer 26. The p-type contact layer 28c has a thickness of about 5 nm-30 nm and has a thickness of, for example, about 10 nm-20 nm.

The p-side contact electrode 30 is provided on the p-type semiconductor layer 28. The p-side contact electrode 30 can be in ohmic contact with the p-type semiconductor layer 28 (more specifically, the p-type contact layer 28c) and is made of a material having a high reflectivity for the deep ultraviolet light emitted by the active layer 26. The p-side contact electrode 30 includes a rhodium (Rh) layer 30a, an aluminum (Al) layer 30b, a titanium (Ti) layer 30c, and a titanium nitride (TiN) layer 30d.

The Rh layer 30a is provided to be directly in contact with the upper surface of the p-type semiconductor layer 28. It is preferred to configure the Rh layer 30a to have a small thickness in order to increase the ultraviolet reflectivity of the p-side contact electrode 30. It is preferred that the thickness of the Rh layer 30a is 10 nm or smaller and, more preferably, 5 nm or smaller. The Al layer 30b is provided to be directly in contact with the upper surface of the Rh layer 30a. It is preferred to configure the Al layer 30b to have a large thickness in order to increase the ultraviolet light reflectivity of the p-side contact electrode 30. It is preferred to configure the thickness of the Al layer 30b to be 20 nm or larger and, more preferably, 100 nm or larger.

The Ti layer 30c is provided to be directly in contact with the upper surface of the Al layer 30b. The Ti layer 30c is provided to prevent the Al layer 30b from being oxidized. It is preferred that the thickness of the Ti layer 30c is 10 nm or larger and, more preferably, 25 nm or larger. By configuring the thickness of the Ti layer 30c to be 10 nm or larger, the Al layer 30b is suitably prevented from being oxidized in association with the use of the semiconductor light-emitting element 10, and the reflectivity and flatness of the p-side contact electrode 30 are prevented from dropping. The thickness of the Ti layer 30c is, for example, about 10 nm-50 nm.

The TiN layer 30d is provided on the Ti layer 30c. The TiN layer 30d is made of TiN having conductivity. The conductivity of the TiN layer 30d is $1 \times 10^{-5}$ Ω·m or lower, and, for example, about $4 \times 10^{-7}$ Ω·m. The thickness of the TiN layer 30d is 5 nm or larger and, for example, about 10 nm-100 nm. By providing the TiN layer 30d, adhesion between the p-side contact electrode 30 and the protective layer 34 can be improved. The TiN layer 30d is not essential, and the TiN layer 30d may not be provided.

By configuring the thickness of the Rh layer 30a to be 10 nm or smaller and the thickness of the Al layer 30b to be 20 nm or larger, the contact resistance of the p-side contact electrode 30 of $1\times10^{-2}\Omega\cdot cm^2$ or smaller (e.g., $1\times10^{-4}\Omega\cdot cm^2$ or smaller) and the reflectivity of 70% or higher (e.g., about 71%-81%) for ultraviolet light having a wavelength of 280 nm can be obtained. In this specification, the reflectivity of the p-side contact electrode 30 for ultraviolet light incident from the p-type semiconductor layer 28 and having a wavelength of 280 nm will be referred to as "first reflectivity R1".

The p-side contact electrode 30 is formed inside the first region W1. The region in which the p-side contact electrode 30 is formed is defined as "third region W3". The p-side contact electrode 30 is formed to be in ohmic contact with the p-type semiconductor layer 28 over the entirety of the third region W3 and to have a high reflectivity for deep ultraviolet light over the entirety of the third region W3. It is preferred that the layers 30a-30d forming the p-side contact electrode 30 be formed to have a uniform thickness over the entirety of the third region W3. This allows the p-side contact electrode 30 to function as a highly efficient reflection electrode that reflects the ultraviolet light from the active layer 26 and guides it toward the second principal surface 20b of the substrate 20 and to function as a low-resistance contact electrode over the entirety of the third region W3. It is preferred that the p-side contact electrode 30 does not contain gold (Au), which could cause reduction in the ultraviolet reflectivity.

The n-side contact electrode 32 is provided on the second upper surface 24b of the n-type semiconductor layer 24. The n-side contact electrode 32 is provided in the second region W2 different from the first region W1 in which the active layer 26 is provided. The n-side contact electrode 32 is made of a material that can be in ohmic contact with the n-type semiconductor layer 24 and has a high reflectivity for the deep ultraviolet light emitted by the active layer 26. The n-side contact electrode 32 includes a first Ti layer 32a, an Al layer 32b, a second Ti layer 32c, and a TiN layer 32d.

The first Ti layer 32a is provided to be directly in contact with the second upper surface 24b of the n-type semiconductor layer 24. The thickness of the first Ti layer 32a is about 1 nm-10 nm and, preferably, 5 nm or smaller and, more preferably, 1 nm-2 nm. By configuring the first Ti layer 32a to have a small thickness, the ultraviolet reflectivity of the n-side contact electrode 32 as viewed from the n-type semiconductor layer 24 can be increased. The Al layer 32b is provided to be directly in contact with the upper surface of the first Ti layer 32a. It is preferred to configure the Al layer 32b to have a large thickness in order to increase the ultraviolet light reflectivity of the n-side contact electrode 32. It is preferred to configure the thickness of the Al layer 32b to be 100 nm or larger and, more preferably, 200 nm or larger. The thickness of the Al layer 32b is, for example, about 200 nm-600 nm.

The second Ti layer 32c is provided to be directly in contact with the upper surface of the Al layer 32b. The second Ti layer 32c is provided to prevent the Al layer 32b from being oxidized. It is preferred that the thickness of the second Ti layer 32c is 10 nm or larger and, more preferably, 25 nm or larger. The thickness of the Ti layer 30c is, for example, about 25 nm-50 nm.

The TiN layer 32d is provided on the second Ti layer 32c. The TiN layer 32d is made of TiN having conductivity. The conductivity of the TiN layer 32d is $1\times10^{-5}\Omega\cdot m$ or lower, and, for example, about $4\times10^{-7}\Omega\cdot m$. The thickness of the TiN layer 32d layer is 5 nm or larger and, for example, about 10 nm-100 nm. By providing the TiN layer 32d, adhesion between the n-side contact electrode 32 and the protective layer 34 can be improved. The TiN layer 32d is not essential, and the TiN layer 32d may not be provided.

By configuring the thickness of the first Ti layer 32a to be 10 nm or smaller and the thickness of the Al layer 32b to be 100 nm or larger, the contact resistance of the n-side contact electrode 32 of $1\times10^{-2}\Omega\cdot cm^2$ or smaller (e.g., $1\times10^{-3}\Omega\cdot cm^2$ or smaller) and the reflectivity of 80% or higher (e.g., about 85%-90%) for ultraviolet light having a wavelength of 280 nm can be obtained. In this specification, the reflectivity of the n-side contact electrode 32 for ultraviolet light incident from the n-type semiconductor layer 24 and having a wavelength of 280 nm will be referred to as "second reflectivity R2".

The n-side contact electrode 32 is formed inside the second region W2. The region in which the n-side contact electrode 32 is formed is defined as "fourth region W4". It is preferred that the layers 32a-32d forming the n-side contact electrode 32 be formed to have a uniform thickness over the entirety of the fourth region W4. This allows the n-side contact electrode 32 to function as a highly efficient reflection electrode that reflects the ultraviolet light from the active layer 26 and guides it toward the second principal surface 20b of the substrate 20 and to function as a low-resistance contact electrode over the entirety of the fourth region W4. It is preferred that the n-side contact electrode 32 does not contain gold (Au), which could cause reduction in the ultraviolet reflectivity.

The protective layer 34 is provided to cover the side surface (also referred to as a mesa surface 40) of the active layer 26 and the p-type semiconductor layer 28. The protective layer 34 covers the upper surface and the side surface of the p-side contact electrode 30 in a portion different from a p-side pad opening 38p above the p-side contact electrode 30. The protective layer 34 covers the upper surface and the side surface of the n-side contact electrode 32 in a portion different from an n-side pad opening 38n above the n-side contact electrode 32.

The protective layer 34 is made of an oxide dielectric material such as silicon oxide ($SiO_2$), silicon oxynitride (SiON), or aluminum oxide ($Al_2O_3$). The protective layer 34 may be made of a nitride dielectric material such as silicon nitride (SiN) or aluminum nitride (AlN) or may be comprised of a stack structure of an oxide layer and an oxide layer. The portion of the protective layer 34 directly in contact with the p-side contact electrode 30 or the n-side contact electrode 32 may be comprised of an oxide layer and may include at least an oxide dielectric material. The thickness of the protective layer 34 is, for example, 100 nm or larger and is, for example, about 500 nm-2000 nm. By configuring the protective layer 34 to have a large thickness, the surfaces of the respective layers formed on the n-type semiconductor layer 24 are suitably covered and protected.

The protective layer 34 is made of a material having a lower refractive index than the active layer 26 or the p-type semiconductor layer 28. The portion of the protective layer 34 directly in contact with the active layer 26 or the p-type semiconductor layer 28 may be comprised of an oxide layer. Oxides such as $SiO_2$ and $Al_2O_3$ have a lower refractive index than a nitride such as SiN and AlN. Configuring the protective layer 34 to include an oxide layer enlarges a refraction index difference of the protective layer 34 relative to the active layer 26 or the p-type semiconductor layer 28 and allows ultraviolet light to be totally reflected efficiently at the interface between the active layer 26 or the p-type semiconductor layer 28 and the protective layer 34.

FIG. 1 shows that the side surface (the mesa surface 40) of the active layer 26 and the p-type semiconductor layer 28 is perpendicular to the substrate 20. Alternatively, the mesa surface 40 may be sloped at a predetermined slope angle with respect to the substrate 20. A slope angle of the mesa surface 40 is equal to or more than 15° and equal to or less than 50° and is, for example, equal to or more than 20° and equal to and less than 40°. Denoting the refractive index of the active layer 26 by n, it is preferred that the slope angle θ of the mesa surface 40 satisfies $\theta < \{\pi/2 + \sin^{-1}(1/n)\}/2$. Setting the slope angle θ of the mesa surface 40 to such a value prevents the ultraviolet light from being totally reflected by the second principal surface 20b of the substrate 20 and failing to be output outside the substrate 20.

The p-side pad electrode 36p and the n-side pad electrode 36n are portions bonded when the semiconductor light-emitting element 10 is mounted on a package substrate or the like. The p-side pad electrode 36p is provided on the protective layer 34 and is electrically connected to the p-side contact electrode 30 in the p-side pad opening 38p. The n-side pad electrode 36n is provided on the protective layer 34 and is electrically connected to the n-side contact electrode 32 in the n-side pad opening 38n.

From the perspective of providing resistance to corrosion, the p-side pad electrode 36p and the n-side pad electrode 36n are configured to contain Au. For example, the pad electrodes are comprised of a Ni/Au, Ti/Au, or Ti/Pt/Au stack structure. In the case the p-side pad electrode 36p and the n-side pad electrode 36n are bonded by gold-tin (AuSn), an AuSn layer embodying the metal joining member may be included in the p-side pad electrode 36p and the n-side pad electrode 36n.

Figure 2:
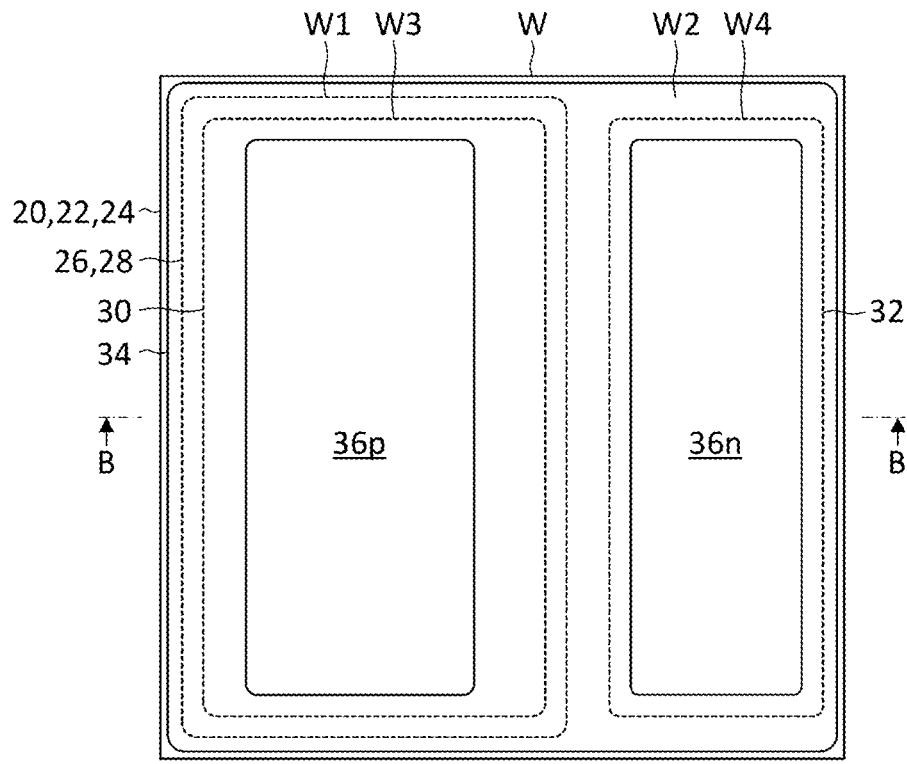
FIG. 2 is a top view schematically showing a configuration of the semiconductor light-emitting element according to the embodiment.

FIG. 2 is a top view schematically showing a configuration of the semiconductor light-emitting element 10 according to the embodiment. FIG. 1 described above corresponds to a B-B cross section of FIG. 2. The outer shape of the semiconductor light-emitting element 10 is defined by the outer circumference of the substrate 20 and is rectangular or square. An area S0 (also referred to as a total area) of a region W occupied by the semiconductor light-emitting element 10 in a plan view of FIG. 2 is equal to the area of the first principal surface 20a or the second principal surface 20b of the substrate 20. The first region W1 is a region in which the active layer 26 and the p-type semiconductor layer 28 are formed. The area of the first region W1 is about 55%-65% of the total area S0. The second region W2 is a region in which the active layer 26 or the p-type semiconductor layer 28 is not formed and is a region excluding the first region W1. The area of the second region W2 is about 35%-45% of the total area S0.

The third region W3 is a region in which the p-side contact electrode 30 is formed and is a region slightly smaller than the first region W1. The area (also referred to as the first area S1) of the third region W3 occupied by the p-side contact electrode 30 is about 45%-50% of the total area S0 and is 80% or more or 90% or more of the area of the first region W1 (i.e., the upper surface of the p-type semiconductor layer 28). The fourth region W4 occupied by the n-side contact electrode 32 is a region in which the n-side contact electrode 32 is formed and is a region smaller than the second region W2. The area of the fourth region W4 (also referred to as the second area S2) is about 25%-30% of the total area S0. Therefore, the first area S1 (45%-50%) occupied by the p-side contact electrode 30 is larger than the second area S2 (25%-30%) occupied by the n-side contact electrode 32 (i.e., S1>S2). For example, the first area S1 is configured to be 1.5 times the second area S2 or larger.

Further, the area occupied by the p-side contact electrode 30 and the n-side contact electrode 32, i.e., a sum (S1+S2) of the first area S1 and the second area S2 is 70%-80% of the total area S0.

In the example shown in FIG. 2, the third region W3 in which the p-side contact electrode 30 is formed and the fourth region W4 in which the n-side contact electrode 32 is formed are rectangles chamfered at the four corners by curves. The third region W3 and the fourth region W4 need not necessarily be shaped in rectangles chamfered at the four corners by curves but may have an arbitrary shape. For example, the third region W3 and the fourth region W4 may be formed in a comb-tooth shape such that the comb teeth of the regions are inserted into each another.

According to this embodiment, the reflection efficiency of the p-side contact electrode 30 and the n-side contact electrode 32 as reflection electrodes can be 60% or higher with respect to the total area S0 of the semiconductor light-emitting element 10. In this specification, the reflection efficiency Rt of the element as a whole can be defined as Rt=(S1/S0)×R1+(S2/S0)×R2. As already described, the total area of the principal surface of the substrate 20 is denoted as S0, the area (the first area) on the p-type semiconductor layer 28 in which the p-side contact electrode 30 is formed as S1, the area (the second area) on the n-type semiconductor layer 24 in which the n-side contact electrode 32 is formed as S2, the reflectivity (the first reflectivity) of the p-side contact electrode 30 for ultraviolet light incident from the p-type semiconductor layer 28 and having a wavelength of 280 nm as R1, and the reflectivity (the second reflectivity) of the n-side contact electrode 32 for ultraviolet light incident from the n-type semiconductor layer 24 and having a wavelength of 280 nm as R2.

In an embodiment, the p-side contact electrode 30 is comprised of an Rh/Al/Ti/TiN layer having a thickness of 5 nm/100 nm/25 nm/25 nm, and the n-side contact electrode 32 is comprised of a Ti/Al/Ti/TiN layer having a thickness of 2 nm/600 nm/25 nm/25 nm. In this embodiment, the first reflectivity R1 is about 81%, and the second reflectivity R2 is about 89%. Therefore, the first reflectivity R1 and the second reflectivity R2 are both 80% or higher, and the first reflectivity R1 is equal to lower than the second reflectivity R2 (i.e., R1≤R2). In this embodiment, the first area S1 of 46% or larger and the second area S2 of 26% or larger cause the reflection efficiency Rt of the element as a whole to be 60% or higher. Given that, for example, the first area S1 is 47% and the second area S2 is 27%, the reflection efficiency Rt of the element as a whole will be 62%.

Figure 3:
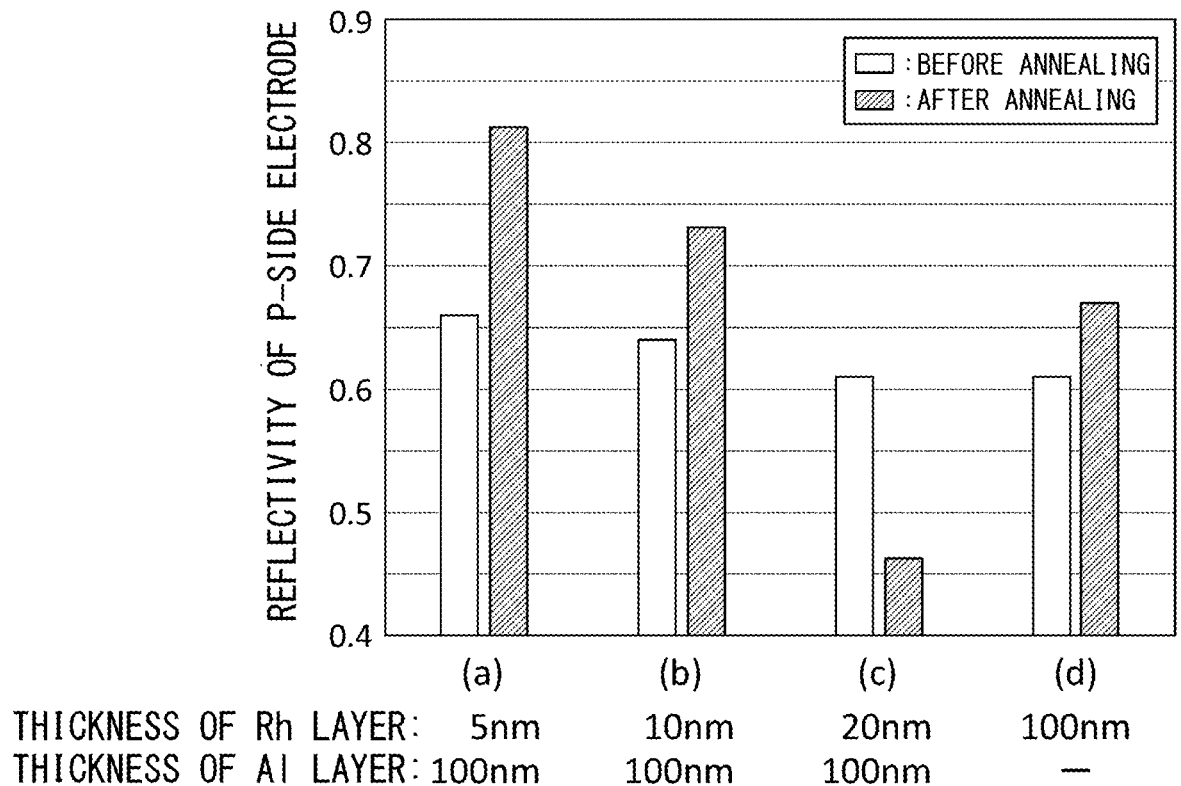
FIG. 3 is a graph showing the reflectivity of the p-side contact electrode.

FIG. 3 is a graph showing the reflectivity of the p-side contact electrode 30. FIG. 3 shows the reflectivity of the p-side contact electrode 30 for ultraviolet light having a wavelength of 280 nm when the thickness of the Rh layer 30a is (a) 5 nm, (b) 10 nm, (c) 20 nm, or (d) 100 nm. (a)-(c) show the reflectivity occurring when the Al layer 30b having a thickness of 100 nm is stacked, and (d) shows the reflectivity occurring when the Al layer 30b is not stacked and the Rh layer is provided alone. FIG. 3 shows the reflectivity before annealing process and the reflectivity after annealing process of the p-side contact electrode 30. In the example of FIG. 3, the p-side contact electrode 30 is annealed for one minute at the annealing temperature of 600° C. in a nitrogen atmosphere.

As shown in FIG. 3, the smaller the thickness of the Rh layer 30a, the higher the ultraviolet reflectivity in the conditions before the annealing process, but the reflectivity is less than 70% in any of the conditions (a)-(d). Before the annealing process, the reflectivity is not so different from the reflectivity of 66% of the Rh layer alone. In the conditions after annealing process, the reflectivity varies significantly depending on the thickness of the Rh layer 30a. In the conditions (a) and (b), in which the thickness of the Rh layer 30a is 10 nm or smaller, in particular, the reflectivity is 70% or higher. The reflectivity of 81% is obtained in the condition (a), and 73% in the condition (b). The reflectivity in (a) and (b) is higher than the reflectivity of 66% of the Rh layer alone in (d) by 5% or larger. This is estimated to be because the ultraviolet reflectivity is improved as compared with the Rh layer alone as a result of the materials of the Rh layer 30a and the Al layer 30b being mixed due to the annealing process. In the condition (c) in which the thickness of the Rh layer 30a is 20 nm, on the other hand, the annealing process causes the reflectivity to drop to lower than 50%. This is estimated to be because the annealing process has disturbed the interface between the Rh layer 30a and the Al layer 30b with the result that unevenness with a large height is formed.

FIG. 3 shows that, it is ensured that the reflectivity of the p-side contact electrode 30 for ultraviolet light having a wavelength of 280 nm is 70% or higher by configuring the Rh layer 30a to have a thickness of 10 nm or smaller and annealing the p-side contact electrode 30. In particular, it is ensured that the reflectivity of the p-side contact electrode 30 for ultraviolet light having a wavelength of 280 nm is 80% or higher by configuring the Rh layer 30a to have a thickness of 5 nm or smaller and annealing the p-side contact electrode 30.

Figure 4:
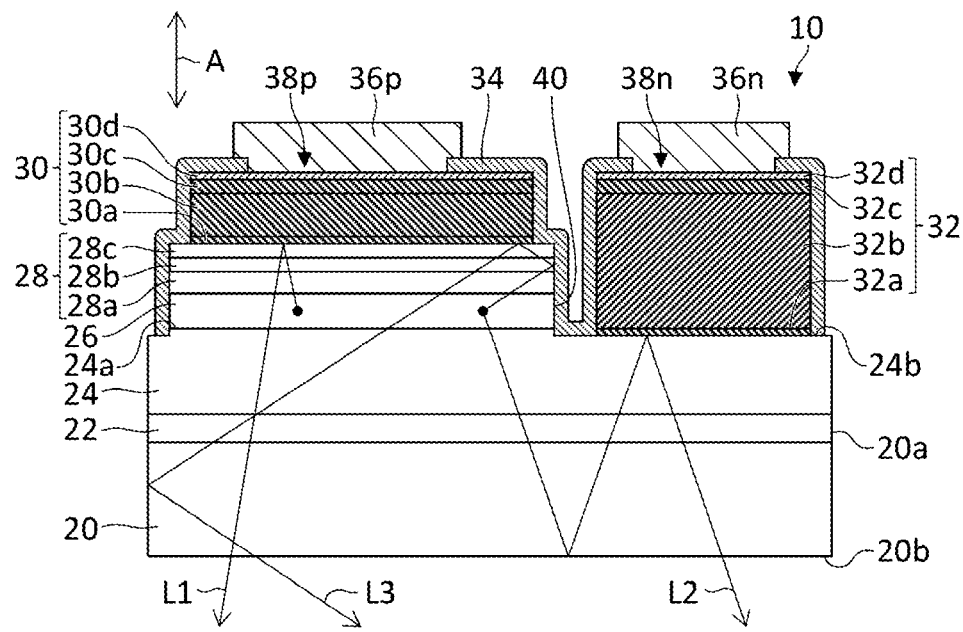
FIG. 4 schematically shows the function of the reflection electrode.

FIG. 4 schematically shows the function of the reflection electrode and illustrates ultraviolet light rays L1, L2, L3 emitted toward the second principal surface 20b of the substrate 20. The first light ray L1 represents the light reflected by the p-side contact electrode 30 before traveling toward the second principal surface 20b of the substrate 20. By configuring the first area S1 and the first reflectivity R1 of the p-side contact electrode 30 to be large, the intensity of ultraviolet light like the first light ray L1 reflected by the p-side contact electrode 30 and then output to the outside can be increased. The second light ray L2 represents the light reflected by the n-side contact electrode 32 and then traveling toward the second principal surface 20b of the substrate 20. By configuring the second area S2 and the second reflectivity R2 of the n-side contact electrode 32 to be large, the intensity of ultraviolet light like the second light ray L2 reflected by the n-side contact electrode 32 and then output to the outside can be increased. The third light ray L3 represents the light reflected by the mesa surface 40 of the active layer 26 or the p-type semiconductor layer 28 and then traveling toward the second principal surface 20b of the substrate 20. By providing the protective layer 34 having a low refractive index, the proportion of ultraviolet light totally reflected by the mesa surface 40 can be increased, and the intensity of ultraviolet light like the third light ray L3 reflected by the mesa surface 40 and then output to the outside can be increased.

Each of the light rays L1-L3 as illustrated shows a case in which the light is reflected only once by the p-side contact electrode 30, the n-side contact electrode 32, or the mesa surface 40. There is also ultraviolet light that is reflected multiple times inside the semiconductor light-emitting element 10 before being output outside. Further, there is also ultraviolet light reflected by both the p-side contact electrode 30 and the n-side contact electrode 32 before being output outside. According to this embodiment, the intensity of ultraviolet light output from the second principal surface 20b of the substrate 20 can be suitably increased by defining the reflection efficiency Rt of the element as a whole and configuring the semiconductor light-emitting element 10 such that the reflection efficiency Rt is 60% or higher. In this way, the light extraction efficiency of the semiconductor light-emitting element 10 can be increased according to this embodiment.

According to this embodiment, the area of the first region W1 in which the active layer 26 is provided can be enlarged by configuring the first area S1 occupied by the p-side contact electrode 30 to be larger than the second area S2 occupied by the n-side contact electrode 32. By increasing the proportion of the area of the first region W1 occupied by the active layer 26, the light emission efficiency per a unit area of the substrate 20 can be increased, and the light extraction efficiency of the semiconductor light-emitting element 10 can be increased.

According to this embodiment, the quantity of ultraviolet light absorbed by the p-type contact layer 28c can be reduced by reducing the thickness of the p-type contact layer 28c. In other words, the quantity of attenuation of ultraviolet light reciprocally transmitted through the p-type contact layer 28c and reflected by the p-side contact electrode 30 as indicated by the first light ray L1 can be reduced. In this way, the light extraction efficiency of the semiconductor light-emitting element 10 can be increased.

Figure 5:
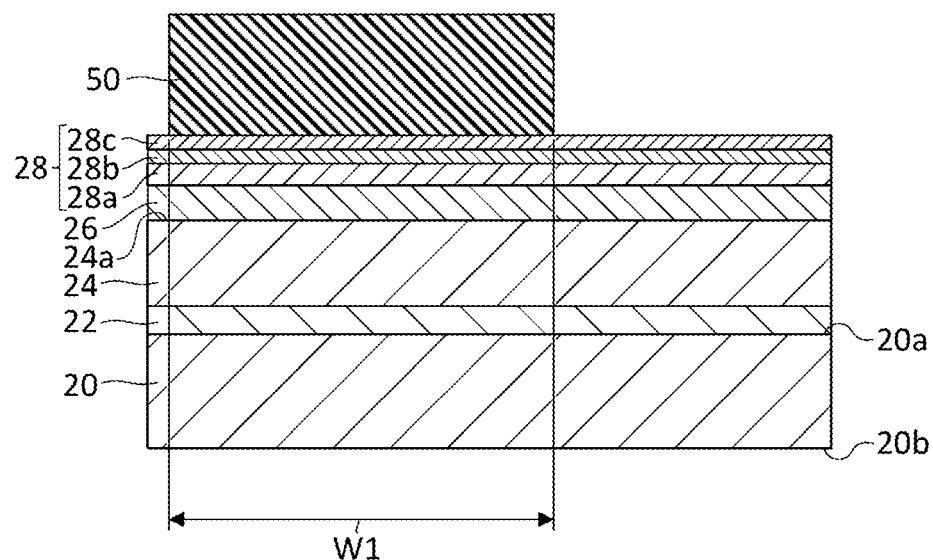
FIG. 5 schematically shows a step of manufacturing the semiconductor light-emitting element.

A description will now be given of a method of manufacturing the semiconductor light-emitting element 10. FIGS. 5-10 schematically show steps of manufacturing the semiconductor light-emitting element 10. Referring to FIG. 5, the base layer 22, the n-type semiconductor layer 24, the active layer 26, the p-type semiconductor layer 28 (the p-type first clad layer 28a, the p-type second clad layer 28b, and the p-type contact layer 28c) are first formed on the first principal surface 20a of the substrate 20 successively.

The substrate 20 is, for example, a patterned sapphire substrate. The base layer 22 includes, for example, an HT-AlN layer and an undoped AlGaN layer. The n-type semiconductor layer 24, the active layer 26, and the p-type semiconductor layer 28 are semiconductor layers made of an AlGaN-based semiconductor material, an AlN-based semiconductor material, or a GaN-based semiconductor material and can be formed by a well-known epitaxial growth method such as the metal organic vapor phase epitaxy (MOVPE) method and the molecular beam epitaxy (MBE) method.

Subsequently, a mask 50 is formed in the first region W1 on the p-type semiconductor layer 28. The mask 50 is an etching mask for forming the side surface (the mesa surface 40) of the active layer 26 and the p-type semiconductor layer 28. The mask 50 can be formed by using a publicly known photolithographic technology. The mask 50 may be formed such that the side surface of the mask 50 is sloped. The slope angle of the side surface of the mask 50 is defined such that the mesa surface 40 sloped at the predetermined slope angle θ is formed in the subsequent etching step.

Figure 6:
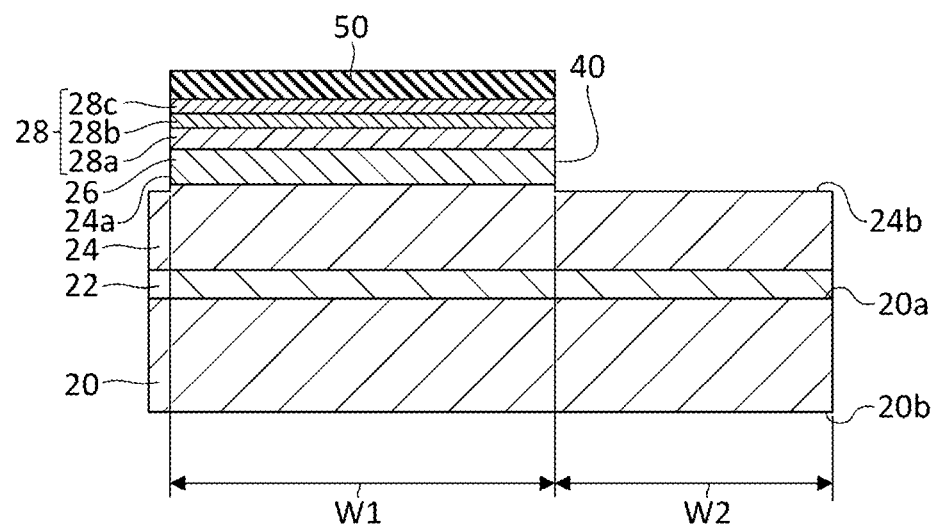
FIG. 6 schematically shows a step of manufacturing the semiconductor light-emitting element.

Subsequently, as shown in FIG. 6, the p-type semiconductor layer 28 and the active layer 26 are etched from above the mask 50 to expose the n-type semiconductor layer 24 in the second region W2 not overlapping the mask 50. Through this etching step, the mesa surface 40 is formed, and the second upper surface 24b of the n-type semiconductor layer 24 is formed. Reactive ion etching using a chlorine-based etching gas can be used in the etching step of FIG. 6. For example, inductively coupled plasma (ICP) etching may be used. For example, a reactive gas including chlorine (Cl) such as chlorine ($Cl_2$), boron trichloride ($BCl_3$), and silicon tetrachloride ($SiCl_4$) can be used as the etching gas. A reactive gas and an inert gas may be combined for dry etching, and an inert gas such as argon (Ar) may be mixed with the chlorine-based gas. The mask 50 is removed after the mesa surface 40 and the second upper surface 24b are formed.

Figure 7:
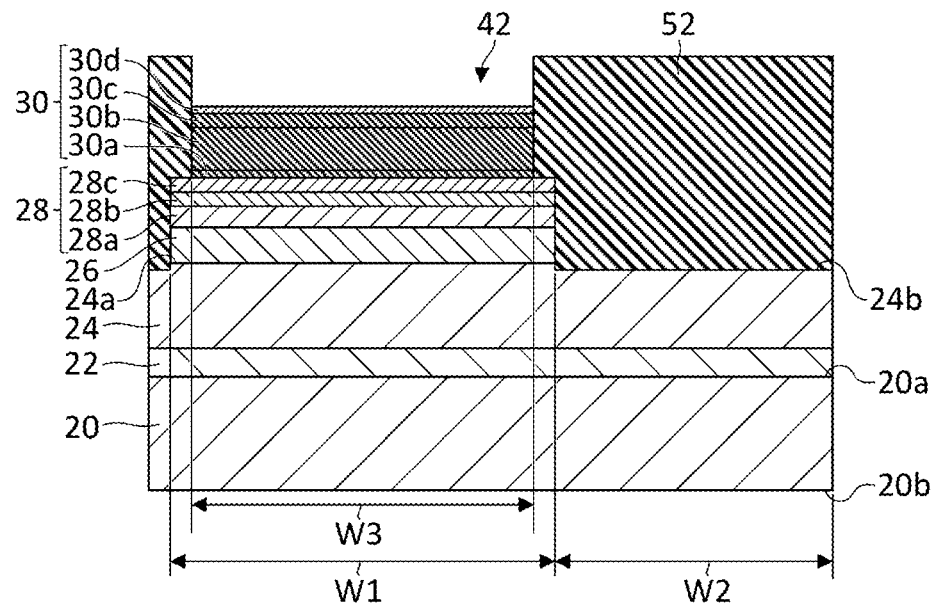
FIG. 7 schematically shows a step of manufacturing the semiconductor light-emitting element.

Subsequently, as shown in FIG. 7, a mask 52 having an opening 42 in the third region W3 is formed, and the p-side contact electrode 30 is formed in the third region W3 on the p-type semiconductor layer 28. The mask 52 can be formed by using, for example, a publicly known photolithographic technology. The p-side contact electrode 30 can be formed by stacking the Rh layer 30a, the Al layer 30b, the Ti layer 30c, and the TiN layer 30d successively. The layers 30a-30d forming the p-side contact electrode 30 can be formed by sputtering. It is preferred that the p-side contact electrode 30 be formed on the p-type semiconductor layer 28 immediately after the mesa surface 40 is formed. Stated otherwise, it is preferred to form the p-side contact electrode 30 before the n-side contact electrode 32 is formed. This realizes proper ohmic contact between the p-type semiconductor layer 28 and the p-side contact electrode 30.

The mask 52 is then removed, and the p-side contact electrode 30 is annealed. The p-side contact electrode 30 is annealed at a temperature below the melting point of Al (about 660° C.). For example, the p-side contact electrode 30 is annealed at a temperature equal to or more than 500° C. and equal to or less than 650° C. and, preferably, at a temperature equal to or more than 550° C. and equal to or less than 625° C. Annealing the p-side contact electrode 30 ensures that the contact resistance of the p-side contact electrode 30 is $1\times10^{-2}\Omega\cdot cm^2$ or smaller (e.g., $1\times10^{-4}\Omega\cdot cm^2$ or smaller), and the reflectivity for ultraviolet light having a wavelength of 280 nm is 70% or higher (e.g., about 71%-81%).

Figure 8:
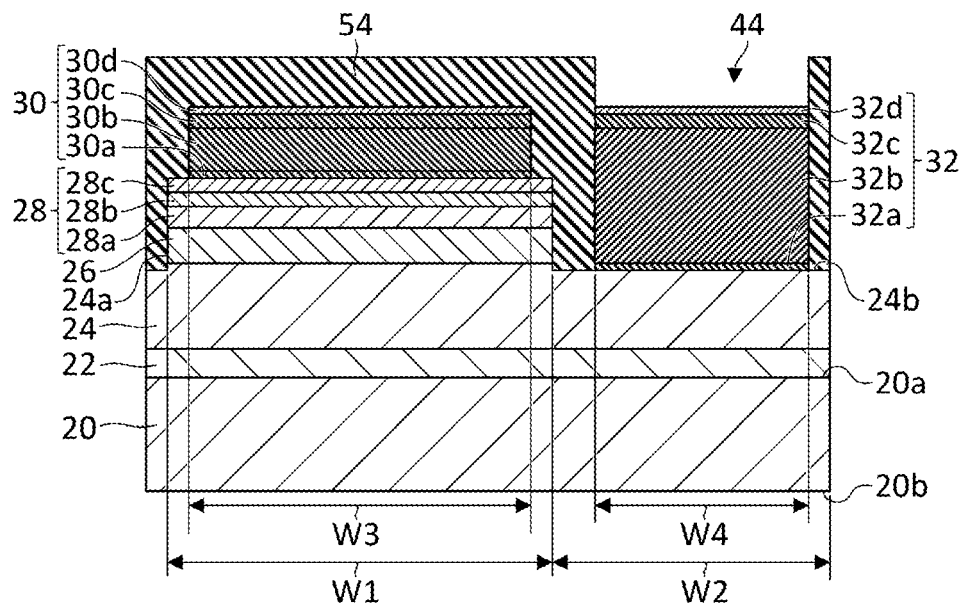
FIG. 8 schematically shows a step of manufacturing the semiconductor light-emitting element.

Subsequently, as shown in FIG. 8, a mask 54 having an opening 44 is formed in the fourth region W4, and the n-side contact electrode 32 is formed in the fourth region W4 on the second upper surface 24b of the n-type semiconductor layer 24. The mask 54 can be formed by using, for example, a publicly known photolithographic technology. The n-side contact electrode 32 can be formed by stacking the first Ti layer 32a, the Al layer 32b, the second Ti layer 32c, and the TiN layer 32d successively. The layers 32a-32d forming the n-side contact electrode 32 can be formed by sputtering.

The mask 54 is then removed, and the n-side contact electrode 32 is annealed. The n-side contact electrode 32 is annealed at a temperature below the melting point of Al (about 660° C.). For example, the n-side contact electrode 32 is annealed at a temperature equal to or more than 500° C. and equal to or less than 650° C. and, preferably, at a temperature equal to or more than 550° C. and equal to or less than 625° C. Annealing ensures that the contact resistance of the n-side contact electrode 32 is $1\times10^{-2}\Omega\cdot cm^2$ or smaller. Further, the annealing temperature of equal to or more than 560° C. and equal to or less than 650° C. enhances the flatness of the n-side contact electrode 32 after the annealing process and produces an ultraviolet reflectivity of 80% or higher (e.g., about 90%).

Figure 9:
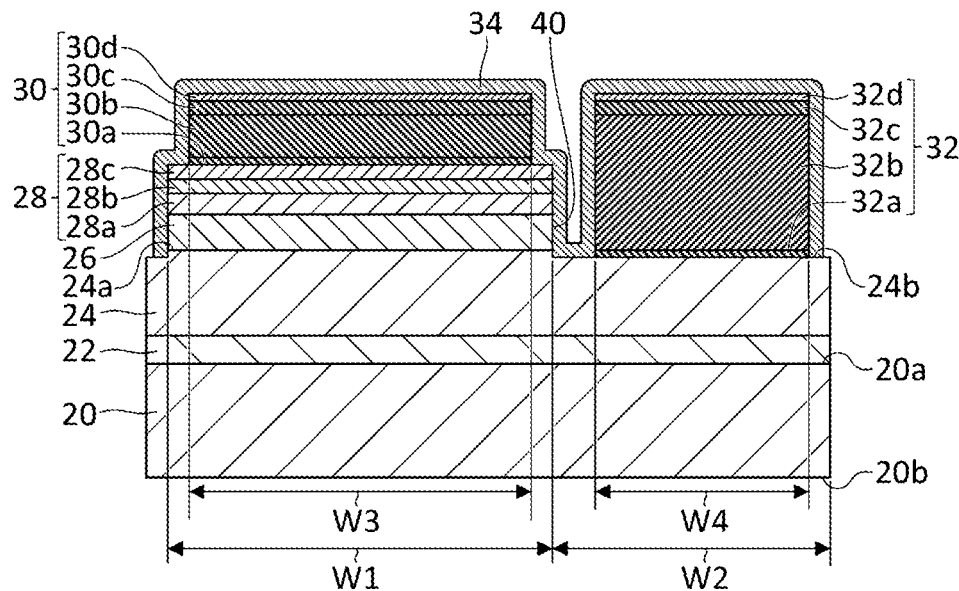
FIG. 9 schematically shows a step of manufacturing the semiconductor light-emitting element.

Subsequently, the protective layer 34 is formed as shown in FIG. 9. The protective layer 34 is formed to cover the entirety of the upper surface of the element structure. The protective layer 34 is provided to cover the upper surface and the side surface of the p-side contact electrode 30 and the n-side contact electrode 32 and to cover the exposed surfaces of the active layer 26 and the p-type semiconductor layer 28 including the mesa surface 40. The protective layer 34 is provided to cover at least a part of the second upper surface 24b of the n-type semiconductor layer 24.

Figure 10:
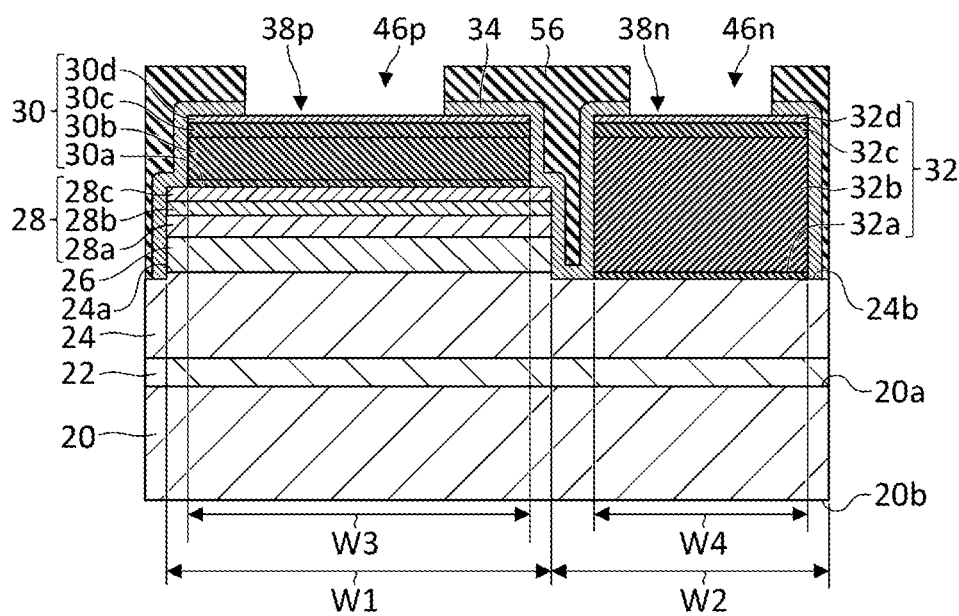
FIG. 10 schematically shows a step of manufacturing the semiconductor light-emitting element.

Subsequently, as shown in FIG. 10, a mask 56 having openings 46p, 46n is formed, and the protective layer 34 in a portion in which the mask 56 is not provided is removed. The mask 56 can be formed by using, for example, a publicly known photolithographic technology. The openings 46p, 46n of the mask 56 are positioned above the p-side contact electrode 30 and the n-side contact electrode 32, respectively. The protective layer 34 can be dry-etched by using a CF-based etching gas such as a hexafluoroethane ($C_2F_6$) gas. This etching step forms the p-side pad opening 38p in which the p-side contact electrode 30 is exposed and the n-side pad opening 38n in which the n-side contact electrode 32 is exposed.

In this dry-etching step of FIG. 10, the TiN layer 30d of the p-side contact electrode 30 and the TiN layer 32d of the n-side contact electrode 32 function as an etching stop layer. TiN is poorly reactive to a fluorine-based etching gas for removing the protective layer 34 so that by-products from etching are not easily produced. Therefore, the p-side contact electrode 30 and the n-side contact electrode 32 can be prevented from being damaged in the etching step of the protective layer 34. Consequently, the exposed surface of the p-side contact electrode 30 in the p-side pad opening 38p and the exposed surface of the n-side contact electrode 32 in the n-side pad opening 38n are maintained at a high quality.

Subsequently, the p-side pad electrode 36p is formed to fill the p-side pad opening 38p, and the n-side pad electrode 36n is formed to fill the n-side pad opening 38n. The p-side pad electrode 36p and the n-side pad electrode 36n can be formed by, for example, depositing an Ni layer or a Ti layer and depositing an Au layer thereon. A further, different metal layer may be provided on the Au layer. For example, a stack structure of an Sn layer, an AuSn layer or an Sn/Au layer may be formed. The p-side pad electrode 36p and the n-side pad electrode 36n may be formed by using the mask 56 or formed by using a resist mask separate from the mask 56. After the p-side pad electrode 36p and the n-side pad electrode 36n are formed, the mask 56 or the separate resist mask is removed.

The semiconductor light-emitting element 10 shown in FIG. 1 is completed through the steps described above. According to this embodiment, the requirements for suitable contact resistance and ultraviolet reflectivity in the p-side contact electrode 30 and the n-side contact electrode 32 can be met at the same time, and the light extraction efficiency can be improved. According to this embodiment, by using the p-side contact electrode 30 including a combination of the Rh layer 30a having a thickness of 10 nm or smaller and the Al layer 30b having a thickness of 20 nm or larger, the reflectivity can be suitably increased as compared with a case of configuring the p-side contact electrode 30 to include only the Rh layer. In particular, the thickness of the Rh layer 30a of 5 nm or smaller ensures that the reflectivity of the p-side contact electrode 30 is 80% or higher. As compared with a case of using the Rh layer alone to configure the p-side contact electrode 30, the light extraction efficiency can be improved by about 8%.

Described above is an explanation based on an exemplary embodiment. The present invention is not limited to the embodiments described above, and it will be understood by those skilled in the art that various design changes are possible and various modifications are possible and that such modifications are also within the scope of the present invention.

What is claimed is:

1. A semiconductor light-emitting element comprising:
an n-type semiconductor layer made of an n-type AlGaN-based semiconductor material;
an active layer provided on the n-type semiconductor layer and made of an AlGaN-based semiconductor material;
a p-type semiconductor layer provided on the active layer; and
a p-side contact electrode that includes an Rh layer in contact with an upper surface of the p-type semiconductor layer and having a thickness of 10 nm or smaller and an Al layer in contact with an upper surface of the Rh layer and having a thickness of 20 nm or larger;
wherein the p-side contact electrode is annealed such that a reflectivity of the p-side contact electrode for ultraviolet light incident from the p-type semiconductor layer and having a wavelength of 280 nm is 70% or higher.

2. The semiconductor light-emitting element according to claim 1, wherein an area in which the Rh layer and the Al layer of the p-side contact electrode are formed is 80% of an area of the upper surface of the p-type semiconductor layer or larger.

3. The semiconductor light-emitting element according to claim 1, wherein the p-side contact electrode further includes a Ti layer provided on the Al layer and having a thickness of 10 nm or larger.

4. The semiconductor light-emitting element according to claim 3, further comprising:
a protective layer that has a p-side pad opening provided on the p-side contact electrode, covers the p-side contact electrode in a portion different from the p-side pad opening, and includes an oxide dielectric material; and
a p-side pad electrode provided on the protective layer and connected to the p-side contact electrode in the p-side pad opening.

* * * * *